(12) United States Patent
Ohtsuka et al.

(10) Patent No.: US 7,199,044 B2
(45) Date of Patent: Apr. 3, 2007

(54) METHOD FOR MANUFACTURING SEMICONDUCTOR DEVICE

(75) Inventors: Nobuyuki Ohtsuka, Ibaraki (JP); Akira Furuya, Ibaraki (JP); Shinichi Ogawa, Osaka (JP); Hiroshi Okamura, Ibaraki (JP)

(73) Assignee: Fujitsu Limited, Kawasaki-Shi, Kanagawa (JP)

( * ) Notice: Subject to any disclaimer, the term of this patent is extended or adjusted under 35 U.S.C. 154(b) by 216 days.

(21) Appl. No.: 10/867,735

(22) Filed: Jun. 16, 2004

(65) Prior Publication Data

US 2004/0259381 A1 Dec. 23, 2004

(30) Foreign Application Priority Data

Jun. 18, 2003 (JP) .............................. 2003-173149

(51) Int. Cl.
*H01L 21/4763* (2006.01)
*H01L 21/44* (2006.01)

(52) U.S. Cl. ...................... 438/627; 438/637; 438/648; 438/687

(58) Field of Classification Search ........ 438/626–627, 438/637, 645, 648, 687
See application file for complete search history.

(56) References Cited

U.S. PATENT DOCUMENTS

| 6,013,578 | A | 1/2000 | Jun |
| 6,410,419 | B1 | 6/2002 | Merchant et al. |
| 6,514,881 | B1 * | 2/2003 | Coffman ................... 438/780 |
| 6,528,409 | B1 * | 3/2003 | Lopatin et al. ........... 438/618 |
| 6,541,397 | B1 * | 4/2003 | Bencher .................... 438/780 |
| 6,541,842 | B2 | 4/2003 | Meynen et al. |
| 6,713,874 | B1 * | 3/2004 | Hopper et al. ............ 257/760 |
| 6,787,453 | B2 * | 9/2004 | Abell ........................ 438/637 |
| 6,831,003 | B1 * | 12/2004 | Huang et al. ............. 438/627 |
| 6,838,772 | B2 * | 1/2005 | Saitoh et al. ............. 257/758 |
| 2002/0195711 | A1 | 12/2002 | Usami |
| 2003/0170993 | A1 * | 9/2003 | Nagahara et al. ......... 438/694 |
| 2003/0224589 | A1 | 12/2003 | Endo et al. |
| 2004/0053498 | A1 | 3/2004 | Kaji et al. |

FOREIGN PATENT DOCUMENTS

| JP | 09-237838 | 9/1997 |
| JP | 2001-085522 | 3/2001 |
| JP | 2001-85522 | 3/2001 |
| JP | 2002-026121 | 1/2002 |
| JP | 2003-086679 | 3/2003 |
| JP | 2003-338452 | 11/2003 |
| JP | 2004-103971 | 4/2004 |
| WO | WO 02/01621 | 1/2002 |

\* cited by examiner

*Primary Examiner*—Luan Thai
(74) *Attorney, Agent, or Firm*—Leydig, Voit & Mayer, Ltd.

(57) ABSTRACT

In a method for manufacturing a semiconductor device, an insulating film having pores is formed on a substrate, and an opening is formed in the insulating film. Thereafter, a material gas supplying Si or C is supplied to the insulating film. Thereby, deficient elements, such as Si or C, are supplied to the insulating film. Thereafter, the opening, including a barrier metal, is filled with a conductive member to form a wiring structure.

20 Claims, 6 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device. More specifically, the present invention relates to a method for manufacturing a semiconductor device including a step for forming a wiring structure on a substrate.

2. Background Art

Concurrent with the higher integration and miniaturization of semiconductor devices, the reduction of RC delay has been particularly demanded. To cope with this problem, it is considered to use a material having a low resistivity as the material for wirings, and a low-k material having a low dielectric constant as the material for insulating films.

As materials having a low resistivity, the application of Cu or Cu alloys is presently examined. Since Cu has about 35% lower resistivity than Al, which has been used as a material for wirings, and has a high resistance to electromigration, Cu is expected as a material for highly reliable wirings in higher integrated semiconductor devices.

The micro-fabrication of Cu to wiring forms is difficult by etching such as RIE (reactive ion etching), that has been used in the formation of conventional Al wirings and the like. Therefore, a damascene method, wherein Cu is filled in a base film having an opening formed therein, is used as a method for forming Cu wirings, and above all, the dual damascene method for simultaneously forming wirings and via portions has prevailed.

When wirings and via holes are formed using the dual damascene method, specifically, the process starts from forming a barrier metal such as TaN on a base substrate having an opening. Then, a Cu seed film is formed as a seed layer for electrolytic plating, and Cu is filled in via holes using electrolytic plating. Thereafter, the surface is planarized using CMP (chemical mechanical polishing) Thereby, Cu wirings and via plugs formed of Cu are simultaneously formed.

The reason for using the barrier metal is to prevent the diffusion of Cu in the insulating film.

On the other hand, as a low-dielectric-constant (low-k) insulating film, an insulating film having a specific dielectric constant, k, of less than 3.0 has been studied. The examples of materials for such low-k insulating films include polysiloxane, HSQ (hydrogensilsesquioxane), polymethylsiloxane, and MSQ (methyl silsesquioxane). Among these, polymethylsiloxane, MSQ and the like, which have high resistance to heating and processing, are widely used.

The use of a porous insulating film having a specific dielectric constant smaller than about 2.5 is also studied. The porous insulating film has pores of a diameter of several to several tens of angstroms in a low-k film as described above.

However, since a porous insulating film has pores in the film, it has a lower density than ordinary insulating films. Therefore, the porous insulating film is more likely to be damaged than ordinary insulating films, because particles such as plasma, or detergents penetrate deep into the film in the following etching and ashing steps for forming the openings or for processing wirings. If a barrier metal or Cu wiring is formed on such a damaged porous insulating film, the barrier properties have lowered, and the diffusion of Cu is increased. The diffusion of Cu is considered to lead to the degradation of the device performance of the semiconductor device.

SUMMARY OF THE INVENTION

Therefore, the present invention provides an improved method for manufacturing a semiconductor device that can solve the above problems. Specifically, the present invention provides a method to inhibit the diffusion of wiring materials due to damage during the processing of the insulating film when an insulating film having pores is used as an interlayer insulating film and the wiring structure is formed, and to manufacture a highly reliable semiconductor device.

According to one aspect of the present invention, in a method for manufacturing a semiconductor device, an insulating film having pores is formed on a substrate and an opening is formed in said insulating film. A material gas for supplying Si or C into said insulating film is supplied in said insulating film. Thereafter a conductive member is filled at least in said opening.

Other and further objects, features and advantages of the invention will appear more fully from the following description.

DETAILED DESCRIPTION OF THE PREFERRED EMBODIMENTS

Figure 1:
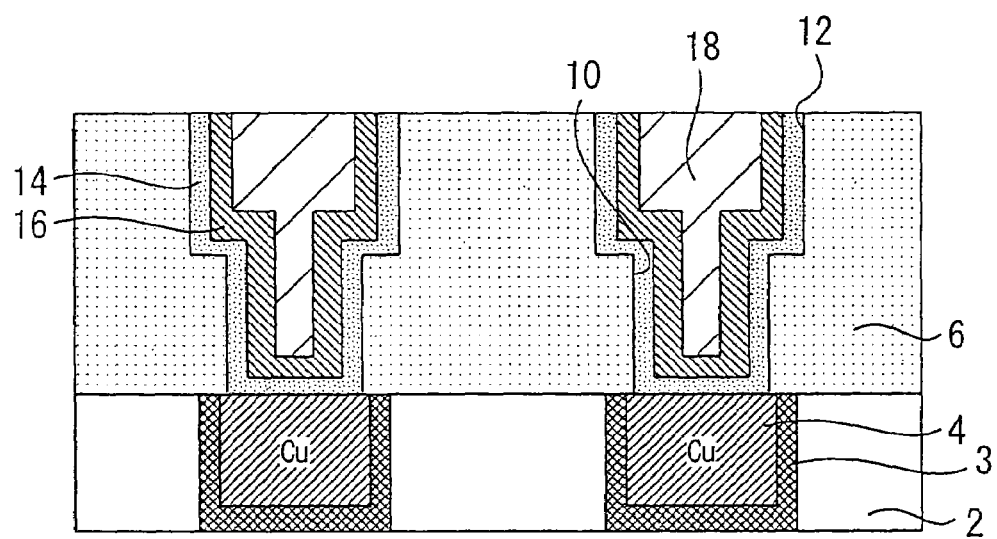
FIG. 1 is a schematic sectional view for illustrating the wiring structure in the first embodiment of the present invention.

The embodiments of the present invention will be described below referring to the drawing. In the drawings, the same or like parts will be denoted by the same reference numerals, and the description thereof will be omitted or simplified.

First, the summary of the embodiments will be described. The present application is applied to these embodiments when plugs, wirings and the like are formed in a porous insulating film.

In general, when plugs, wirings and the like are formed in a porous insulating film, first, a resist mask or a hard mask is formed on a porous insulating film using a lithographic technique. Next, etching is performed using the resist mask or the hard mask to form openings. Thereafter, the mask is removed by ashing as required. Then, barrier-metal films, metal films and the like are formed in the openings formed in the porous insulating film.

As described above, since the porous insulating film has pores therein, it has a lower density than ordinary insulating film. Therefore, the porous insulating film is more likely to be damaged, because particles of plasma or the like, or detergent permeate in the film easily and deeply during steps such as etching and ashing in the formation of openings or wirings. For example, the EDS (Energy Dispersive x-ray Spectroscopy) analysis of the damaged layer in a porous MSQ film revealed that the Si or C content in the layer was lowered. If a barrier metal or a Cu wiring is formed on such a damaged porous insulating film, the area where the content of Si or the like has lowered has especially high possibility of lowering barrier characteristics and increasing Cu diffusion.

In the present invention, therefore, the porous insulating film is restored from damage by supplying Si or C to the damaged area thereof. In the actual restoring method, after forming openings in the porous insulating film, a material gas that can replenish Si or C to the porous insulating film is supplied. Although specific methods will be described below, various supplying methods are considered, such as a method wherein $SiH_4$ is supplied into a film-forming apparatus after the porous insulating film has been formed; and a method wherein plasma is radiated simultaneously with the supply of $SiH_4$.

First Embodiment

FIG. 1 is a schematic sectional view for illustrating the wiring structure in the first embodiment of the present invention.

As FIG. 1 shows, Cu wirings 4 are formed in the substrate 2 through barrier metals 3. Porous MSQ film 6 is formed on the surface of the substrate 2. The porous MSQ film 6 is a low-dielectric-constant (low-k) insulating film having pores and is composed of Si, C, O, or H. The dielectric constant of the porous MSQ film 6 is about 2.5. The percentages of the composing elements are: about 30% Si, about 50% O, about 15% C, and the rest H. The pores in the porous MSQ film 6 occupy about 30% of the volume of the porous MSQ film 6.

Via holes 10 passing through the porous MSQ film 6 are formed on the Cu wirings 4. Trenches 12 passing through the porous MSQ film 8, having a width larger than the diameter of via holes 10 are formed on the via holes 10. The via holes 10 are openings for forming via plug portions in the first embodiment, and the trenches 12 are openings for forming metal-wiring portions in this embodiment.

TaN films 14 are formed on the inner walls of openings consisting of via holes 10 and trenches 12. The TaN films 14 are barrier metal films that serve to prevent Cu diffusion and have a thickness of 1–20 nm.

Cu seed films 16 are formed on the surfaces of the TaN films 14. The thickness of the Cu seed films 16 is 10–100 nm. Cu 18 is filled on the Cu seed films 16.

In the wiring structure of the first embodiment, via plugs are formed in the via holes 10, and wirings are formed in the trenches 12. The wirings are connected to Cu wirings 4 formed in the substrate 2 through the via plugs. Although Cu in the via plugs is connected to Cu wirings 4 through the TaN films 14, Cu in the via plugs may be directly connected to Cu wirings 4 by removing TaN films 14 on the bottom of the via hole 10.

As described above, the contents of Si, O, and C are about 30%, about 50%, and about 15%, respectively, and H occupies the rest. These contents remain substantially constant also in the wall surfaces of the via holes and the trenches 12, which are the vicinities of the boundary between the porous MSQ film 6 and the TaN film 14.

Figure 2:
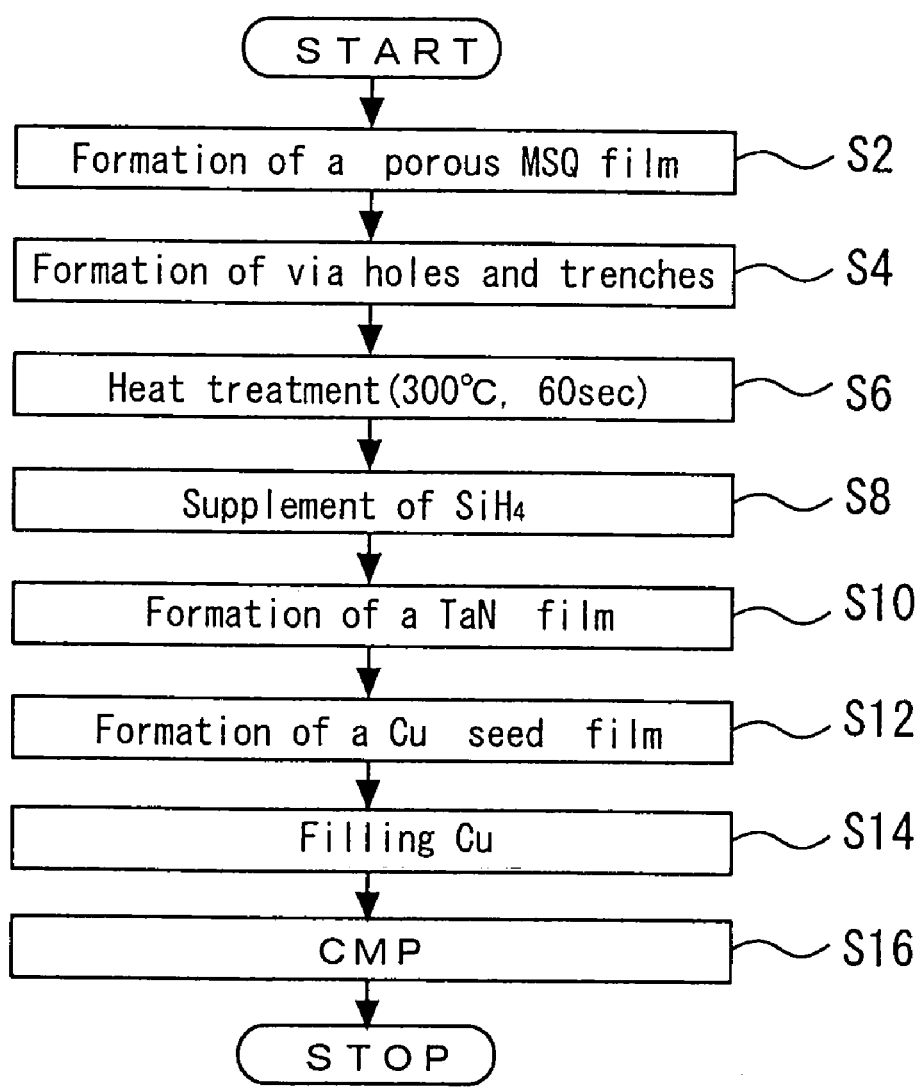
FIG. 2 is a flow diagram for illustrating a method for forming a wiring structure according to the first embodiment of the present invention.

FIG. 2 is a flow diagram for illustrating a method for forming a wiring structure according to the first embodiment. FIGS. 3 to 6 are schematic sectional views each illustrating the state in each step of the formation of the wiring structure.

The method for forming a wiring structure according to the first embodiment will be described below referring to FIGS. 1 to 6.

Figure 3:
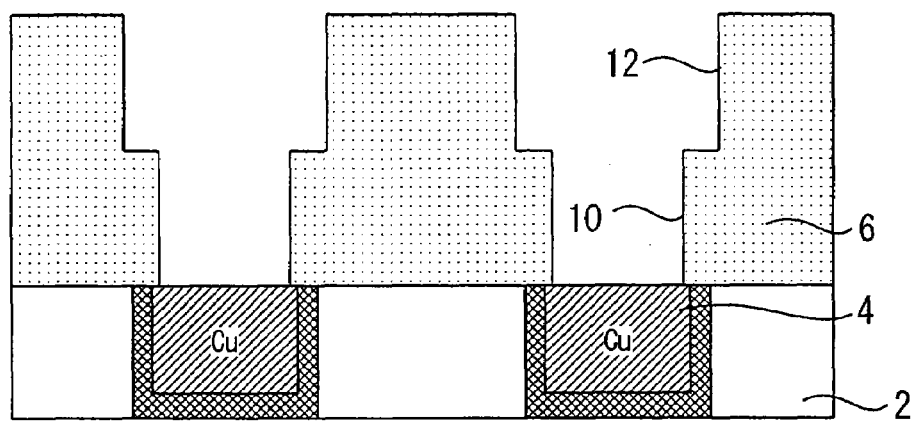
FIGS. 3 to 6 are schematic sectional views each illustrating the state in each step of the formation of the wiring structure according to the first embodiment of the present invention.

First, as FIG. 3 shows, a porous MSQ film 6 is formed on a substrate 2 having Cu wirings 4 formed therein (Step S2). Here, a CVD (chemical vapor deposition) method is used. Thereafter, as FIG. 3 shows, openings are formed in the porous MSQ film 6 (Step S4). Specifically, first, trenches 12 having a predetermined width is formed using a resist mask. Thereafter, a via hole 10 is formed using the resist mask so as to reach the Cu wiring 4 on the substrate 2.

Here, the porous MSQ film 6 is in the state wherein especially the surface is damaged in the etching step for forming openings, and the damaged portion is deficient in Si.

Next, the substrate in this state is put on a susceptor heated to 300° C. in a film-forming apparatus, and held for about 60 seconds (Step S6). Thereby, the temperature of the substrate is also maintained at 300° C.

Next, in this apparatus, $SiH_4$ is supplied onto the substrate for about 10 seconds (Step S8). Thereby, Si is supplied to and replenished in the portion deficient in Si near the surfaces of the porous MSQ film 6.

Figure 4:
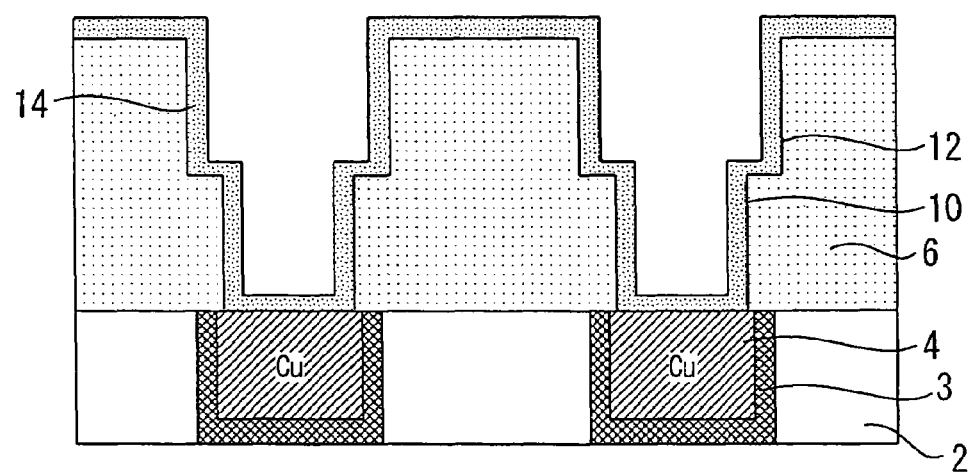

Next, as FIG. 4 shows, a TaN film 14 is formed (Step S10). Here, the TaN film 14 of a thickness of 1–20 nm is formed using a sputtering method, or a CVD method such as ALD (atomic layer deposition) along the inside of the via holes 10 and trenches 12, and the upper surfaces of the porous MSQ films 6.

Figure 5:
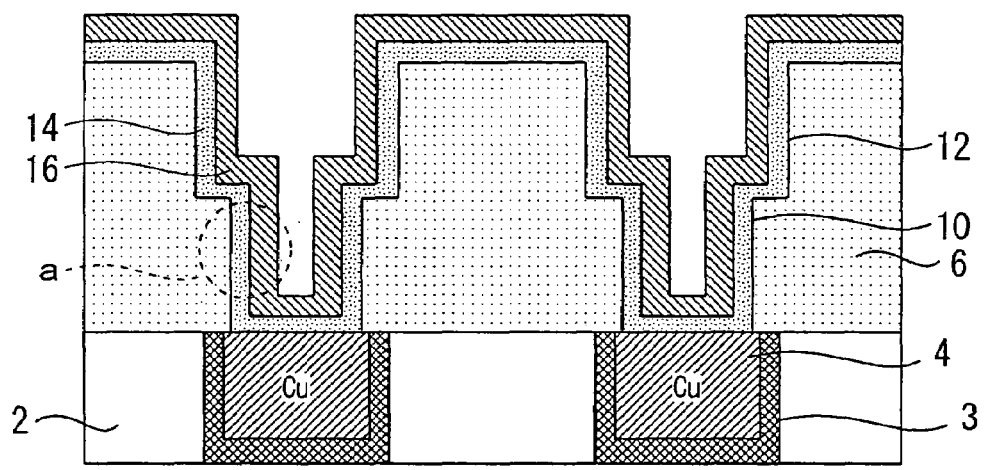

Next, as FIG. 5 shows, a Cu seed film 16 is formed (Step S12). Here, the Cu seed film 16 of a thickness of 10–100 nm is formed using a sputtering method along the surfaces of the TaN film 14.

Figure 6:
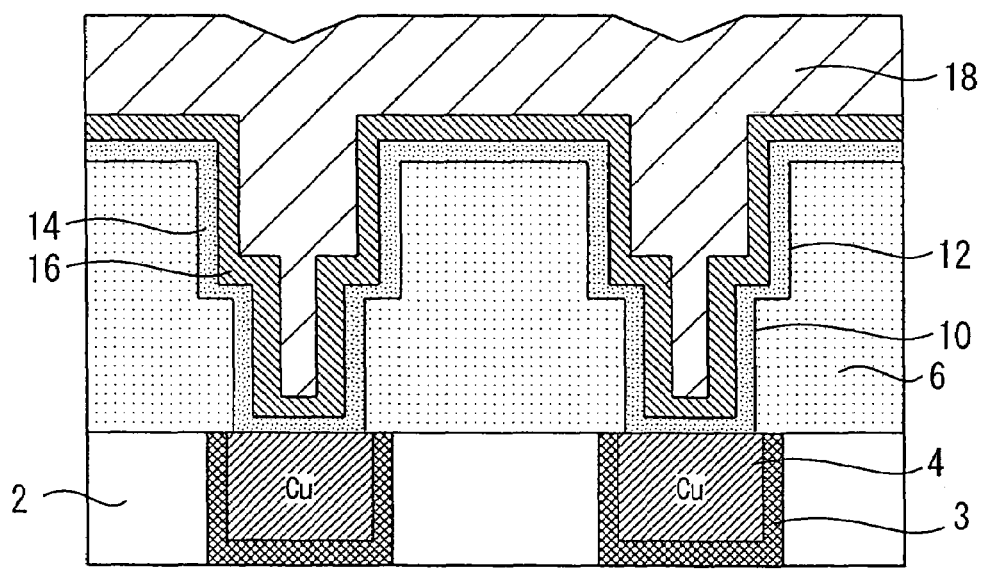

Next, Cu 18 is filled on the inside of the via holes 10 and trenches 12 (Step S14). Here, the Cu 18 is filled by an electrolytic plating method using the cu seed film 16 as the seed layer. Thereby, as FIG. 6 shows, Cu 18 is filled on the Cu seed film 16 in the via holes 10 and the trenches 12, and furthermore, the Cu 18 is also deposited on the Cu seed film 16 on the surface of the porous MSQ film 6.

Next, planarization is performed using CMP (Chemical Mechanical Polishing) (Step S16). This planarization is performed until the surface of the porous MSQ film 6 is exposed, and thereby, the wiring structure of a semiconductor device is formed as FIG. 1 shows.

The EDS analysis of the porous MSQ film 6 in thus formed wiring structure was performed.

Figure 7A:
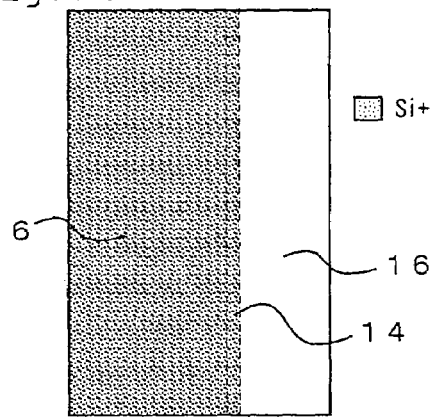
FIGS. 7A to 7F and 8 are graphs for illustrating the results of the EDS analysis of a semiconductor device in the first embodiment, and a conventional semiconductor device.
Figure 7B:
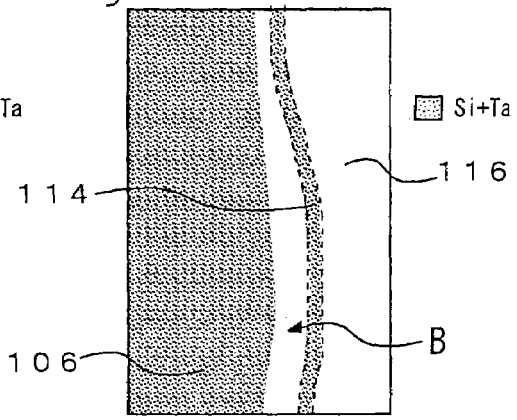
Figure 7C:
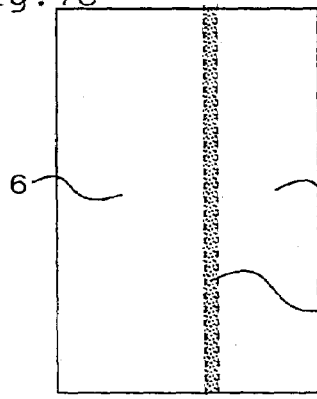
Figure 7D:
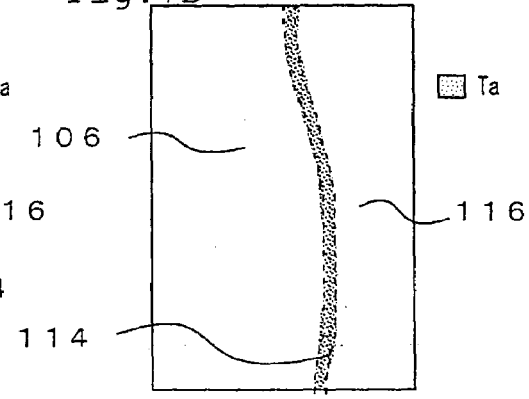
Figure 7E:
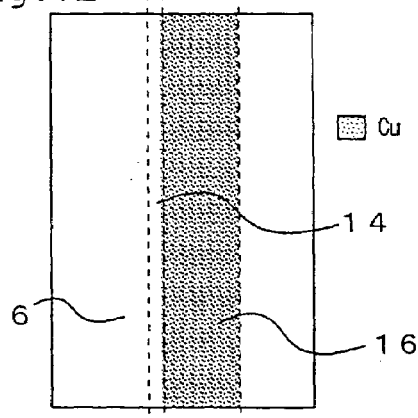
Figure 7F:
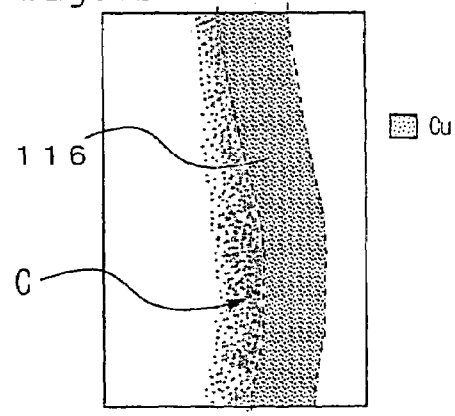

FIGS. 7A to 7F and 8 are graphs for illustrating the results of the EDS analysis of a semiconductor device in the first embodiment, and a conventional semiconductor device. Specifically, FIGS. 7A to 7F schematically show the results of the analysis of elements contained in the vicinity of the area shown by "a" in FIG. 5, and the area of a conventional semiconductor device corresponding thereto; FIGS. 7A and 7B show the distributions of Si and Ta, respectively; FIGS. 7C and 7D show the distribution of Ta, and FIGS. 7E and 7F show the distribution of Cu. FIGS. 7A, 7C and 7E show those of the semiconductor device of the first embodiment; and FIGS. 7B, 7D and 7F show those of the conventional semiconductor device. The numeral 6, 14 and 16 in FIGS. 7A, 7C and 7E are corresponding to the porous MSQ film 6, the TaN film 14 and the Cu seed film 16 of the first embodiment, respectively. The numeral 106, 114 and 116 in FIGS. 7B, 7D and 7F are corresponding to the porous MSQ film, the TaN film and the Cu seed film of the conventional semiconductor device, respectively. Dotted lines in FIGS. 7A to 7F show the boundaries between these films as necessary.

Figure 8:
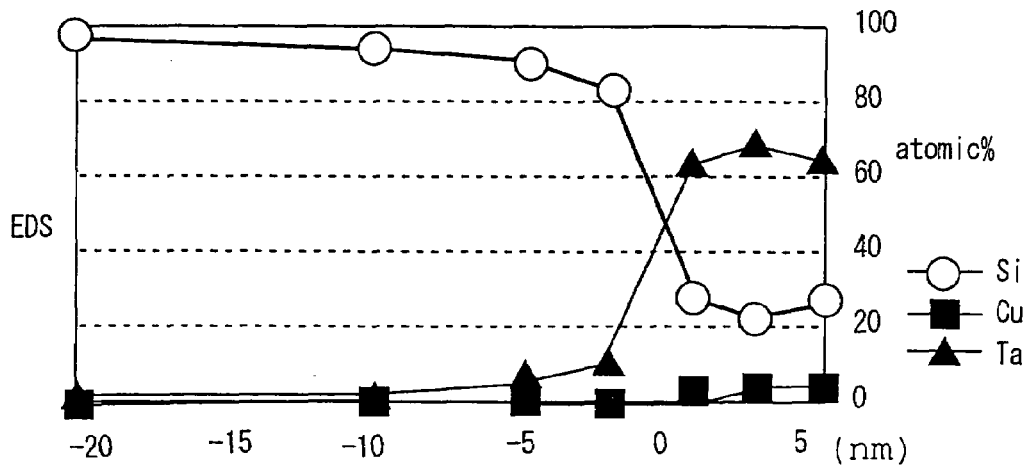

FIG. 8 is a graph for illustrating the quantity of each composing element contained in the vicinity of the area shown by "a" in FIG. 5; the abscissa showing the lateral location (nm) in FIG. 5 when the boundary between the porous MSQ film 6 and the TaN film 14 is the origin "0"; and the ordinate showing the quantity (atomic %) of each element. FIGS. 7A to 7F and 8 show the results of the EDS analysis in the state that TaN film 14 and Cu seed film 16 are formed, as FIG. 5. However, FIG. 8 does not indicate the portion of the Cu seed film 16.

As the arrow B in FIG. 7B shows, in the conventional semiconductor device, there is a Si deficiency area B between the porous MSQ film 106 and the TaN film 114. And as the arrow C in FIG. 7F shows, there is a Cu diffusing area C. The Cu diffusing area C is approximately corresponding to the Si deficiency area B and the area of the TaN film 114 in FIG. 7B. Therefore, it turned out that the diffusion of Cu occurs in the Si deficiency area B and the area of the TaN film 114.

On the other hand, as FIG. 7A and FIG. 8 show, no decrease in the quantity of Si in the porous MSQ film 6 is found in the boundary between the porous MSQ film 6 and the TaN film 14. Therefore, as FIGS. 7C, 7E and FIG. 8 show, the diffusion of Ta and Cu into the porous MSQ film 6 is inhibited. Also as FIG. 7A shows, the Si content is substantially constant from the vicinity of the boundary to the inside of the porous MSQ film 6.

According to the first embodiment, as described above, $SiH_4$ is supplied to the porous MSQ film 6 prior to the formation of the TaN film 14. Thereby, a sufficient quantity of Si can be supplied to the porous MSQ film 6. Therefore, Si is sufficiently replenished in the portion of porous MSQ film 6, deficient in Si damaged due to etching, etc. As a result, the diffusion of Ta and Cu likely occurs in the portion deficient in Si can be prevented, and a highly reliable semiconductor device can be obtained.

Although the first embodiment was described using porous MSQ film 6, the insulating film in the present invention is not limited to porous MSQ films. The present invention can be widely applied to the restoration of damaged low-dielectric-constant films having pores.

In the first embodiment, the case wherein pores in the porous MSQ film 6 occupied about 30% of the volume of the porous MSQ film 6, and the dielectric constant of the porous MSQ film 6 was 2.5 was described. This is because the application of the present invention is significantly effective since the insulating film is weak and is easily damaged, particularly, when pores are contained in the proportion larger than about 30%, or when the dielectric constant is 2.5 or lower. However, the present invention is not limited to these proportion and dielectric constant, but other values may be used.

Also in the first embodiment, the case wherein the contents of Si, O, and C in the porous MSQ film 6 were about 30%, about 50%, and about 15%, respectively, and the rest was occupied by hydrogen was described. This is an example of the proportion of each element in a porous insulating film having good film characteristics when used as the insulating film of a semiconductor device. Since Si decreased in the steps for forming openings and the like is replenished by applying the present invention, the porous MSQ film 6 in the semiconductor device of the present application can maintain this proportion, and can maintain good film characteristics. However, this proportion does not limit the constitution of the insulating film in the present invention.

The first embodiment was described for the case where a wiring structure is formed by connecting Cu wirings 4 formed in the substrate to the Cu wirings formed in the porous MSQ film 6 through via plugs. However, the present invention is not limited to the formation of a wiring structure having via plugs, but a wiring structure having contact plugs or the like may also be formed.

The first embodiment was also described for the case where a Cu wiring structure is formed by a dual damascene method using Cu as a wiring material. Although the method of the present invention is particularly effective to Cu wirings because Cu is apt to diffuse, the present invention can also be applied to the formation of wiring structures using other materials. Even when Cu is used, the method for forming the wiring structure is not limited to the dual damascene method, but other methods such as a single damascene method can also be used.

For example, the case wherein the method of the present application is applied to the method using a single damascene method will be specifically described. First, after forming an insulating film such as a porous MSQ film of the first layer or the like, via holes (or contact holes) for via plugs (or contact plugs) are formed. Here, in order to restore the porous MSQ which is damaged during the formation of the holes therein, the substrate is placed in the film-forming apparatus, and is exposed to $SiH_4$ gas for about 10 seconds as is explained in the first embodiment. Thereafter, a barrier metal, Cu, or the like is deposited in the contact holes, and polished by CMP. Furthermore, after forming a porous MSQ film of the second layer, a trench for wiring is formed. Again in order to restore damaged porous MSQ, the multi-layer structure having the second layer is exposed to $SiH_4$ gas for about 10 seconds in the film-forming apparatus. By doing this, the method for restoring damaged porous MSQ according to the present application can be applied to the single damascene method. The application of this method is not limited to the single damascene method and the dual damascene method, but can be widely applied as the means for restoring the porous insulating film damaged by etching or ashing.

The first embodiment was also described for the case where Si is supplied using $SiH_4$, for replenishing deficient Si since Si is deficient when the porous MSQ film 6 is damaged. However, in the present invention, the supplied material gas is not limited to $SiH_4$. For example, the material that can supply Si—R (R represents H or molecular groups constituted by $C_nH_m$) such as $SiH_n$, and the like may also be used. The use of these gases can also replenish deficient Si.

When C is deficient instead of Si, $C_nH_m$, $CH_4$, $C_nH_mOH$, $CH_3OH$, $C_nH_mCOOH$, $HCOOH$, or the like can be supplied to replenish deficient C. For example, when $CH_4$ is supplied, the $CH_4$ may be supplied for about 30 seconds in place of the supply of $SiH_4$ (Step S8) in the first embodiment.

Also the present invention is not limited to the supply of either one of Si or C, but a deficient element may be supplied by adequately selecting a material that contains the deficient element depending on the deficient element, for a time suited to the material. Therefore, for example, both Si and C may be supplied. In this case, it is preferred that any one of Si or C is first supplied, or Si and C are simultaneously supplied.

In the first embodiment, the case where a TaN film 14 is used as a barrier metal was also described. However, the barrier metal in the present invention is not limited thereto, but other barrier metal films such as a TiN film may also be used. Although the barrier metal is formed here for preventing diffusion of Cu, the formation of the barrier metal such as the TaN film 14 is not required if the diffusion of Cu or other conductive materials filled in the via holes 10, the trenches 12, or the like can be sufficiently inhibited or can be ignored.

Second Embodiment

Figure 9:
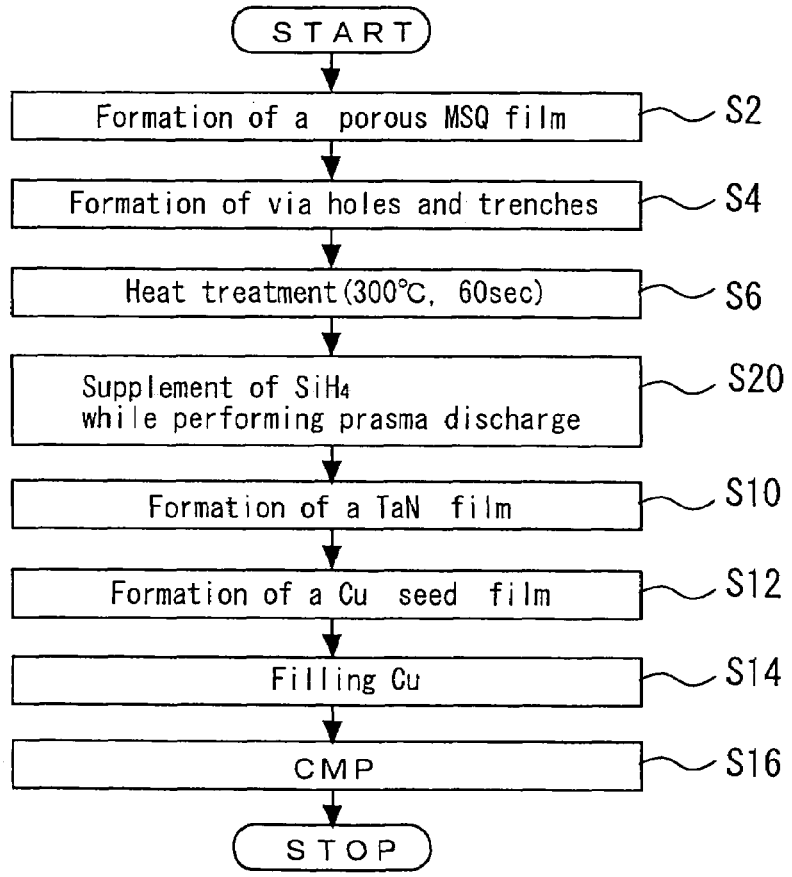
FIG. 9 is a flow diagram for illustrating a method for forming a wiring structure according the second embodiment of the present invention.

FIG. 9 is a flow diagram for illustrating a method for forming a wiring structure according the second embodiment of the present invention.

The wiring structure formed in the second embodiment is identical to the wiring structure described in the first embodiment. However, in the second embodiment, a more effective method for forming a wiring structure will be described.

Specifically, the method for forming a wiring structure described in the second embodiment resembles to the method described in the first embodiment. In the second embodiment, however, $SiH_4$ is supplied while performing plasma discharge (Step S20). Plasma discharge is specifically performed using a plasma CVD apparatus, and at the same time of supplying $SiH_4$ in the plasma CVD apparatus, plasma is discharged. Here, as the conditions for plasma discharge, the pressure is about 100 to 500 Pa, and the flow rate of Ar is 10 to 500 sccm.

Other steps are identical with the steps described in the first embodiment.

In the second embodiment, as described above, plasma discharge is performed when $SiH_4$ is supplied. Thereby, deficient Si in the porous MSQ film 6 can be more effectively complemented in the porous MSQ film 6. Therefore, the diffusion of Cu and Ta into the porous MSQ film 6 can be more effectively prevented.

The conditions for plasma discharge described in the second embodiment do not limit the present invention. However, when the object for restoring the porous MSQ film 6 from damage is considered, and the prevention of damage to the substrate by plasma radiation is considered, the conditions of a pressure of about 100 to 500 Pa, and a flow rate of Ar of 10 to 500 sccm are preferred.

Since other steps are the same as the steps of the first embodiment, the description thereof will be omitted.

The present invention was described as a method for manufacturing a semiconductor device. However, the present invention can be translated as a novel invention of a semiconductor device manufactured using such a method.

In other words, the semiconductor device of the present invention is a semiconductor device manufactured using the method disclosed in the present invention. Specifically, it is a semiconductor device comprising:

a substrate, an insulating film formed on the substrate, at least containing Si or C, and having pores, openings formed in the insulating film, and reaching a predetermined location of the substrate, and a conductive member filled at least in the openings; wherein the content of Si or C in the vicinity of the boundary between the conductive member and the insulating film in the openings is substantially constant.

In the first and second embodiments, for example, the porous MSQ film 6 is equivalent to the "insulating film having pores" of the present invention; the via hole 10 and trenches 12 are equivalent to the "openings" of the present invention; and $SiH_4$ is equivalent to the "material gas supplying Si or C into the insulating film". In addition, for example, the TaN film 14 is equivalent to the barrier metal, and Cu 18 is equivalent to the conductive member.

Also in the first and second embodiments, for example, the step for forming the insulating film and the step for forming the openings of the present invention are carried out by performing Steps S2 and S4; and the supplying step of the present invention is carried out by performing Step S8. Furthermore, for example, the step for forming the barrier metal of the present invention is carried out by performing Step S10; and the filling step of the present invention is carried out by performing Steps S12 and S14. In the second embodiment, for example, the supplying step of and the step for radiating plasma are simultaneously carried out by performing Step S20.

The features and the advantages of the present invention as described above may be summarized as follows.

According to one aspect of the present invention, material gas supplying Si or C into a insulating film is supplied to the insulating film after forming of an opening therein. Thereby, the damage of the insulating film caused by etching and the like can be restored, and deficient elements such as Si or C in the insulating film can be complemented. Therefore, the diffusion of metals from the upper-layer wirings likely to occur in the portion deficient in the elements can be effectively prevented. Thereby, a semiconductor device having good device characteristics can be formed.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-173149, filed on Jun. 18, 2003 including specification, claims, drawings and summary, on which the Convention priority of the present application is based, are incorporated herein by reference in its entirety.

The invention claimed is:

1. A method for manufacturing a semiconductor device comprising, sequentially:

forming on a substrate an insulating film having pores;

forming an opening in said insulating film;

before filling said opening, supplying a material gas to said insulating film in said opening, said material gas supplying Si to said insulating film in said opening; and filling said opening with a conductive member.

2. The method for manufacturing a semiconductor device according to claim 1 further comprising forming a barrier metal at least on an inner wall of said opening after supplying said material gas and before filling said opening with said conductive member.

3. The method for manufacturing a semiconductor device according to claim 1 further comprising treating said insulating film with a plasma before or at the same time as supplying said material gas to said insulating film in said opening.

4. The method for manufacturing a semiconductor device according to claim 3, including treating said insulating film with the plasma in an ambient at a pressure of about 100 to 500 Pa.

5. The method for manufacturing a semiconductor device according to claim 3, including treating said insulating film with the plasma at an Ar flow rate of about 10 to 500 sccm.

6. The method for manufacturing a semiconductor device according to claim 1, wherein said conductive member is one of Cu and a Cu alloy.

7. The method for manufacturing a semiconductor device according to claim 1, wherein said insulating film contains Si, C, and O.

8. The method for manufacturing a semiconductor device according to claim 7, wherein said insulating film contains about 30% Si, about 50% O, and about 15% C.

9. The method for manufacturing a semiconductor device according to claim 7, wherein said insulating film further contains H.

10. The method for manufacturing a semiconductor device according to claim 9, wherein said insulating film contains about 30% Si, about 50% O, and about 15% C.

11. The method for manufacturing a semiconductor device according to claim 1, wherein said pores occupy at least about 30% of said insulating film.

12. The method for manufacturing a semiconductor device according to claim 1, wherein said insulating film has a dielectric constant not exceeding about 2.5.

13. The method for manufacturing a semiconductor device according to claim 1, wherein said material gas is selected from the group consisting of Si—R (R is H), $SiH_n$, and $SiH_4$.

14. A method for manufacturing a semiconductor device comprising, sequentially:
   forming on a substrate an insulating film having pores;
   forming an opening in said insulating film;
   before filling said opening, supplying a material gas to said insulating film in said opening, said material gas supplying at least one of Si and C to said insulating film in said opening, without treating said insulating film with a plasma before or at the same time as supplying said material gas to said insulating film in said opening; and
   filling said opening with a conductive member.

15. The method for manufacturing a semiconductor device according to claim 14 further comprising forming a barrier metal at least on an inner wall of said opening after supplying said material gas and before filling said opening with said conductive member.

16. The method for manufacturing a semiconductor device according to claim 14, wherein said insulating film contains Si, C, and O.

17. The method for manufacturing a semiconductor device according to claim 16, wherein said insulating film contains about 30% Si, about 50% O, and about 15% C.

18. The method for manufacturing a semiconductor device according to claim 16, wherein said insulating film further contains H.

19. The method for manufacturing a semiconductor device according to claim 14, wherein said pores occupy at least about 30% of said insulating film.

20. The method for manufacturing a semiconductor device according to claim 14, wherein said material gas is selected from the group consisting of $C_nH_m$, $CH_4$, Si—R (R is H or a molecular group composed of $C_nH_m$), $SiH_n$, $SiH_4$, $C_nH_mOH$, $CH_3OH$, $C_nH_mCOOH$, and HCOOH.

* * * * *